(12) United States Patent
Komma et al.

(10) Patent No.: US 8,531,231 B2
(45) Date of Patent: Sep. 10, 2013

(54) SWITCHING DEVICE AND SWITCHING ARRANGEMENTS FOR SWITCHING AT HIGH OPERATING VOLTAGE

(75) Inventors: Thomas Komma, Ottobrunn (DE); Norbert Seliger, Zorneding (DE)

(73) Assignee: Siemens Aktiengesellschaft, München (DE)

( * ) Notice: Subject to any disclaimer, the term of this patent is extended or adjusted under 35 U.S.C. 154(b) by 466 days.

(21) Appl. No.: 12/509,933

(22) Filed: Jul. 27, 2009

(65) Prior Publication Data

US 2010/0026371 A1   Feb. 4, 2010

(30) Foreign Application Priority Data

Jul. 28, 2008 (DE) .......................... 10 2008 035 075

(51) Int. Cl.
*H03K 17/04* (2006.01)
(52) U.S. Cl.
USPC .......................................... 327/374; 327/309
(58) Field of Classification Search
USPC .................. 327/309, 327, 328, 374–377
See application file for complete search history.

(56) References Cited

U.S. PATENT DOCUMENTS

| 4,014,318 A | 3/1977 | Dockum et al. |
| 6,822,842 B2 * | 11/2004 | Friedrichs et al. ............ 361/111 |
| 2004/0130379 A1 * | 7/2004 | Bolz et al. ..................... 327/374 |

FOREIGN PATENT DOCUMENTS

| DE | 101 35 835 C1 | 8/2002 |
| EP | 0 660 513 A2 | 6/1995 |
| JP | 1-280919 | 11/1989 |
| JP | 2-179116 | 7/1990 |

OTHER PUBLICATIONS

German Office Action dated Feb. 2, 2009 for DE 10 2008 035 075.3 with English translation.

* cited by examiner

*Primary Examiner* — Lincoln Donovan
*Assistant Examiner* — Diana J Cheng
(74) *Attorney, Agent, or Firm* — Lempia Summerfield Katz LLC

(57) ABSTRACT

A switching device for switching a high operating voltage is described. The switching device-includes a first switching arrangement with a first self-conducting switching element), which has a control connector and a first and second main connector for forming a switching section. The switching device may include a second switching arrangement having a first and a second connector for forming a switching section, which is wired serially in respect to the switching section of the first switching arrangement. The second switching arrangement includes an optically triggerable switching element for switching the switching section of the second switching arrangement so it becomes conductive. The second connector of the second switching arrangement is connected with the control connector of the first self-conducting switching element.

16 Claims, 5 Drawing Sheets

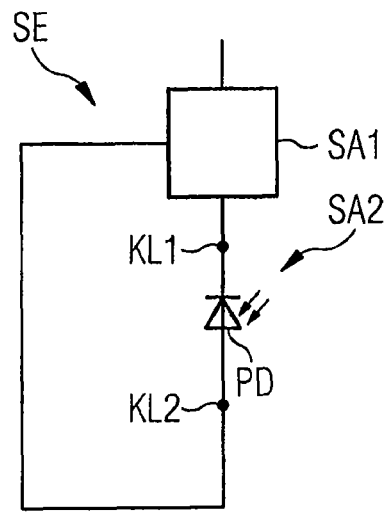
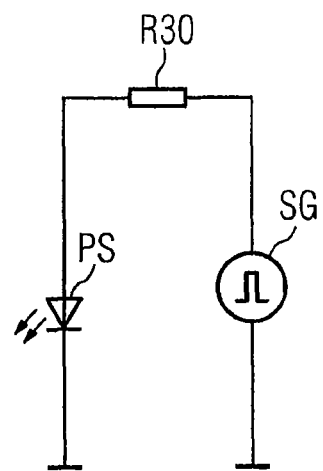
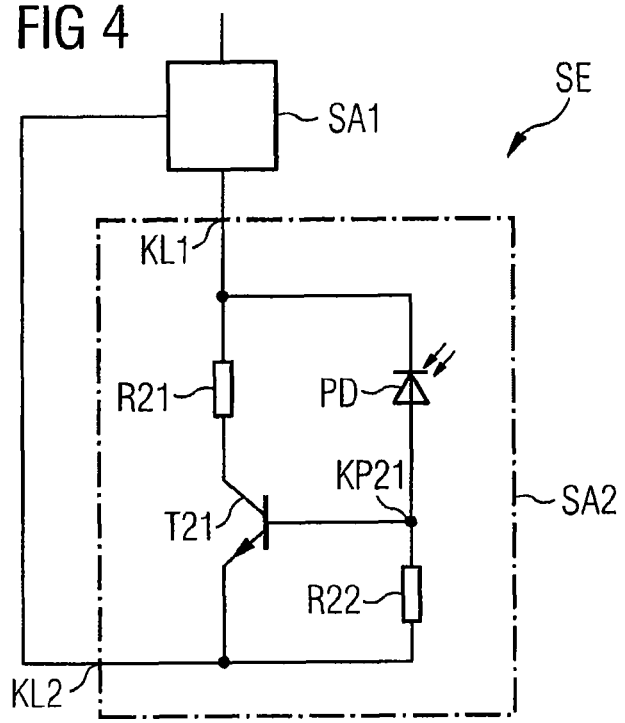

SWITCHING DEVICE AND SWITCHING ARRANGEMENTS FOR SWITCHING AT HIGH OPERATING VOLTAGE

This patent document claims the benefit of DE10 2008 035 075.3 filed Jul. 28, 2008, which is hereby incorporated by reference.

BACKGROUND

The present embodiments relate to a switching device for switching a high operating voltage.

DE 101 35 835 C1 discloses a switching device for switching at a high operating voltage. The switching device combines one low voltage (LV) and at least one high voltage (HV) switching element. This type of combining is called cascade switching. The switching device is used for switching a high electric current and is also capable of safely blocking a high operating voltage. The low voltage switching element is a self-blocking metal-oxide-semiconductor field-effect transistor (MOSFET). A number of high voltage switching elements, which are serially wired with respect to each other (i.e., a cascade circuit), is realized in the form of self-conducting blocking layer field effect transistors (JFETs).

The voltage stability of the switching device is achieved by the serial wiring of the number of the high voltage switching elements. A protective element is provided between the respective control connectors of the high voltage switching element, which causes an automatic take-along effect. The protective element is switched between the two high voltage control connectors in that it has a let-pass behavior in the direction from the first to the second control connector, and in the opposite direction a blocking behavior. As soon as the first high voltage switching element is brought into a blocking state, via the externally controlled low voltage switching element, the further high voltage switching element changes into the blocking state.

If a switching device is required for a higher blocking voltage in the range of more than 50 kV, it can be switched by the switching device described above. However, the switching device represented in DE 101 35 835 C1 has the disadvantage that switching-on of the serially wired high voltage switching elements takes place in steps (intervals) by the breakdown of the serially wired protective elements. The switching device cannot be used in those applications in which the simultaneous opening of the switching elements is required.

When operating X-ray tubes in computer-controlled tomography systems, serially wired high voltage switching elements open or close simultaneously, or at least synchronously in relation to each other. A high direct current (d.c.) voltage of approximately 55 kV is generated by a high voltage network device. The radiation source is operated in a pulsed manner for reducing the radiation exposure, so that a rapid discharge of the existing capacitors must take place. The complete discharge of the (high voltage) capacitors (capacitors and lines, such as cables, for example) by the switching device should take place within 100 to 200 μs.

Switching devices for such applications include the serial circuit consisting of a number of thyristors or IGBTs (Insulated Gate Bipolar Transistors), each of which is coupled with a triggering circuit. It is problematical that these active triggering devices are connected to different electrical potentials. Accordingly, a considerable technical outlay is required, which also leads to increased costs.

SUMMARY AND DESCRIPTION

The present embodiments may obviate one or more of the drawbacks or limitations inherent in the related art. For example, in one embodiment, a switching device has a high blocking voltage and simultaneously can be realized with little technological circuit outlay.

In one embodiment, a switching device for switching a high operating voltage is provided. The switching device includes a first switching arrangement with a first self-conducting switching element, which includes a first and a second main connector for forming a switching section. The switching device includes a second switching arrangement having a first and a second connector for forming a switching section, which is wired serially with respect to the switching section of the first switching arrangement. The second switching arrangement includes an optically triggerable switching element for switching the switching section of the second switching arrangement so switching section becomes conductive. Furthermore, the second connector of the second switching arrangement is connected with the control connector of the first self-conducting switching element.

DE 101 35 835 C1 requires switching a low voltage MOSFET and one or more serially switched high voltage MOSFETs. In accordance with the triggering only required for the low voltage MOSFET, only the triggering of the second switching device needs to take place in the switching arrangement in accordance with the present embodiments. Triggering takes place separate from the potential by the optically triggerable switching element. An energy supply for a triggering circuit required for this is omitted. The second switching arrangement may be realized with a minimal outlay of structural elements.

In one embodiment, the first switching arrangement includes at least one second switching element, which has a control connector and a first and a second main connector for forming a switching section. For forming a switching section of the first switching arrangement, the switching section of the first switching element and the switching section of a second switching element are serially wired with each other. A protective element is switched between the control connectors of the first and second self-conducting switching elements.

By the switching in series of an in principle arbitrary number of second switching elements, it is possible by the serially switched second switching elements to realize a switching device which is suitable for operating at a high operational voltage and which, in particular, also has a high blocking voltage. High voltage may be a voltage of more than 50 kV, in particular 55 kV. Because of the cascaded wiring of the number of second, self-conducting switching elements, a step-by-step switching-on and switching-off of the first and the second switching elements of the first switching arrangement takes place. One advantage of cascading the switching elements of the first switching arrangement lies in that the required circuit outlay is clearly reduced in comparison with a series connection of bipolar switching elements, including the triggering circuits. Accordingly, the space requirements for the switching device are also reduced.

Wiring with the protective element creates an automatic take-along effect, so that a separate triggering of the second switching element is not necessary. The second switching element makes a transition into a blocking state as soon as the first switching element of the first switching arrangement has been placed into a blocking state via the second switching arrangement and a sufficiently high blocking voltage is applied to the protective element. The protective element is switched between the two control connectors of the first and second switching arrangement in such a way that the protective element displays a let-pass behavior in the direction from the first to the second control connector, and in the opposite direction a blocking behavior.

In the blocking direction, the protective element displays a break-down behavior, starting at a defined voltage applied to the protective element. Starting at this so-called protective element break-down voltage, the current is no longer blocked, instead current also flows over the blocking element in the blocking direction. The break-down behavior may be advantageous because the flowing blocking current, for example, starting at this protective element break-down voltage, causes the first and/or second switching elements of the first switching arrangement to switch over from the conducting to the blocking state. A one embodiment, the protective element may be a diode. A Zener diode made of silicon may be used. An avalanche diode made of silicon in particular shows the described advantageous break-down behavior. Such avalanche break-down diodes are available for various protective element break-down voltages.

In one embodiment, the second switching arrangement is exclusively comprised of the optically triggerable switching element. Accordingly, the optically triggerable switching element is a part of the switching section of the switching device and is capable of supporting the current load.

If the optically triggerable switching element is not capable of conducting the current flowing through the switching section in a destruction-free manner then, in accordance with an alternative embodiment, a controllable switching element, such as a bipolar transistor, is arranged in the switching section of the second switching arrangement and may be switched to be conducting or blocking by the optically triggerable switching element. However, simple triggering, in particular potentially separated, is maintained. A switching element, which can carry high voltages flowing through the switching element, is integrated into the switching section.

A first resistor is controllably wired with the controllable switching element, and the optically triggerable switching element is serially wired together with the second resistor, and the serial circuit is connected in parallel with the serial circuit including the first resistor and the controllable switching element. A node point of the serial circuit including the optically triggerable switching element and the first resistor is connected with a control connector of the controllable switching element. The first resistor is used to maintain the controllable switching element in a conducting state, because of which a base current can flow into the control connector of the controllable switching element. The second resistor is used for setting the operating point of the controllable switching element.

Alternatively, a capacitor and a serial circuit from the second resistor are connected parallel with the optically triggerable switching element, and the parallel connection is connected with the second main connector of the controllable switching element, as well as via an uncoupling element with the first main connector of the controllable switching element. A node point of the serial circuit including the optically triggerable switching element and the second resistor is connected with a control connector of the controllable switching element. As a result, an intermediate circuit capacitor is made available, from which the energy required for switching the controllable switching element into the conducting state can be made available. Because of this it is possible to do without the resistor located in the switching section, so that transfer losses can be reduced.

The first self-conducting switching element and/or the at least one second self-conducting switching element may be a JFET (Junction Field Effect Transistor). The first self-conducting switching element and/or the at least one second self-conducting switching element may be a MOSFET, whose gate connector is connected with the source connector by a respective diode. An excess voltage in case of blocking is prevented because of the provision of the diode.

Furthermore, a switching arrangement with a plurality of switching devices, which are serially wired together, is provided, which are respectively embodied in accordance with the above described type. The switching arrangement is includes a plurality of switching devices which are serially wired together and each of which has a first and a second switching arrangement of the type described above. An optically triggerable switching element is provided in each one of the second switching arrangements for switching the switching section of the second switching arrangement into the conductive state. The first switching arrangement may include only the first self-conducting switching element. Also, the switching arrangement may be embodied in such a way that a respective first switching arrangement includes, besides the first self-conducting switching element, an (arbitrary) number of second self-conducting elements. The time for switching-on the entire switching arrangement may be shortened since, because of the plurality of second switching arrangements, each with respective optically triggerable switching elements, it is possible to make a parallel arrangement available.

In one embodiment, a switching arrangement with a high voltage (HV) switching element and a switching device for triggering the high voltage switching element, in which the switching device is embodied according to the above described manner. The high voltage switching element is a voltage-controlled, self-blocking component such as, for example, a power MOSFET for conducting larger currents.

In one embodiment, the high voltage switching element has a control connector and a first and a second main connector for forming a switching section. The switching device and a resistor, which is wired serially with it, are wired parallel with a capacitor. A node point between the switching device and the resistor is connected with the control connector of the high voltage switching element. The parallel circuit includes the capacitor and the serial circuit including the switching device and the resistor connected via an uncoupling element with the first main connector of the high voltage switching element. The energy required by the switching device for triggering the high voltage switching element is obtained from the capacitor, which forms an auxiliary intermediate circuit.

An excess voltage protective element is usefully switched between the control connector and the second main connector of the high voltage switching element. In the course of switching them to be conducting, the voltage applied between the control connector and the second main connector of the high voltage switching element may be limited to a preselected value, so that damage to the high voltage switching element can be avoided.

The high voltage switching element may be a voltage-controlled, self-blocking semiconductor component, such as a MOSFET or an IGBT.

BRIEF DESCRIPTION OF THE DRAWINGS

FIG. 3A shows a schematic representation of the switching device having a first variation of a second switching arrangement, FIG. 3B shows a schematic representation of an arrangement for optically triggering the second switching arrangement, FIG. 4 shows a representation of the switching device having a second variation of the second switching arrangement.

DETAILED DESCRIPTION

Figure 1A:
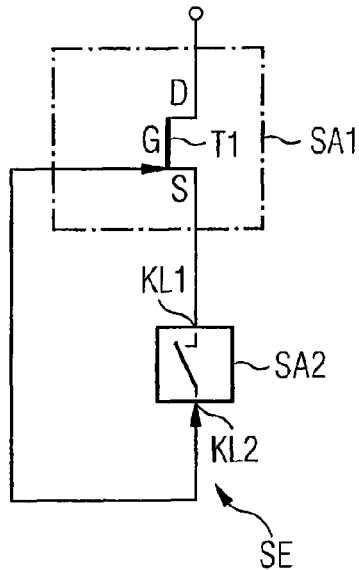
FIGS. 1A, 1B show a schematic representation of one embodiment of a switching device.
Figure 1B:
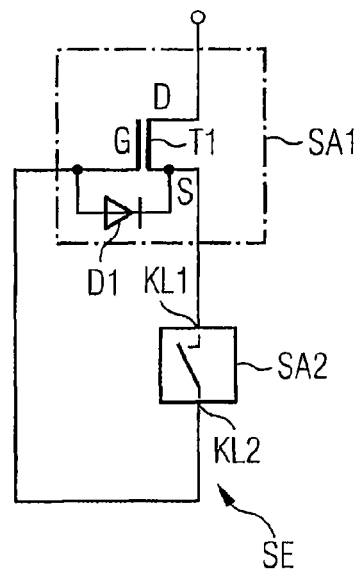

FIGS. 1A and 1B show a switching arrangement SE. The switching arrangement SE includes a first switching device SA1, which is wired in series with a second switching device SA2.

The switching device SA1 has a single self-conducting switching element T1, which in FIG. 1A is a JFET. The JFET has a control connector (gate connector), a first main connector (drain connector D) and a second main connector (source connector S). The gate connector G of the JFET T1 is, at the same time, the control connector of the first switching arrangement. The source connector S of the JFET T1 is the second main connector of the switching arrangement. If, as in the exemplary embodiment of FIG. 1A, the first switching arrangement SA1 only has a first switching element, the drain connector D of the JFET forms the first main connector of the first switching arrangement SA1.

The switching device in FIG. 1B differs from the switching device of FIG. 1A in that the JFET has been replaced by a MOSFET. The switching element T1 designed as a MOSFET has a control connector (gate connector G), a first main connector (drain connector D) and a second main connector (source connector S). The MOSFET, represented in FIG. 1B as a self-conducting switching element, has a diode D1 between its gate connector G and its source connector S, whose anode connector is connected with the gate connector. The cathode connector is connected with the source connector S.

The switching arrangement SA2, which can be realized in a different way, is a switch with a terminal KL1 as the first connector and a terminal KL2 as the second connector.

The first switching arrangement SA1 and the second switching arrangement SA2 are wired together in the manner of a cascade. The terminal KL1 is connected with the source connector of the JFET T1 or the MOSFET T1. The terminal KL2 is connected with the gate connector G of the JFET T1 or the MOSFET T1.

Figure 2A:
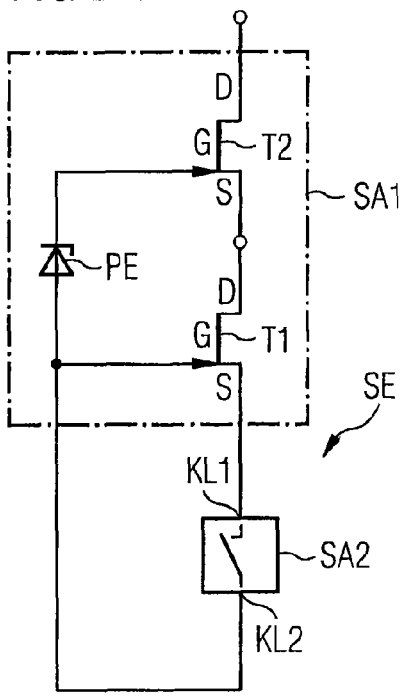
FIGS. 2A, 2B show a schematic representation of one embodiment of a switching device, in which a first switching arrangement includes a first and a second switching element.

In the exemplary embodiment in accordance with FIG. 2A, the first switching arrangement SA1 includes, in addition to the first switching element T1, a second switching element T2, which may be a JFET. The source connector S of the second JFET T2 is connected with the drain connector of the first JFET T1, so that their switching sections are serially wired with each other. The drain connector D of the second JFET T2 is the first main connector of the first switching arrangement SA1. The gate connectors G of the first and second JFET are connected with each other via a protective element PE.

The protective element PE is a Zener diode (Z-diode). The anode connector is connected with the gate connector G of the first JFET T1, while the cathode connector is connected with the gate connector G of the second JFET T2. The protective element PE is switched-in between the gate connectors G of the first and second JFETs in such a way that it displays a let-pass behavior in the direction from the first to the second JFET, and in the opposite direction a blocking behavior. The protective element PE provides the automatic take-along effect described in DE 101 35 835 C1. The second JFET makes a transition into a blocking state as soon as the first JFET is placed into a blocking state via the second switching arrangement.

The first and the second JFET T1, T2 are wired together in a cascade circuit. Depending on the required blocking voltage, the first switching arrangement can have a larger number of second switching elements T2, which are wired together in the manner represented in FIG. 2A. Wiring and the mode of functioning can be taken from DE 101 35 835 C1 of Applicant.

Figure 2B:
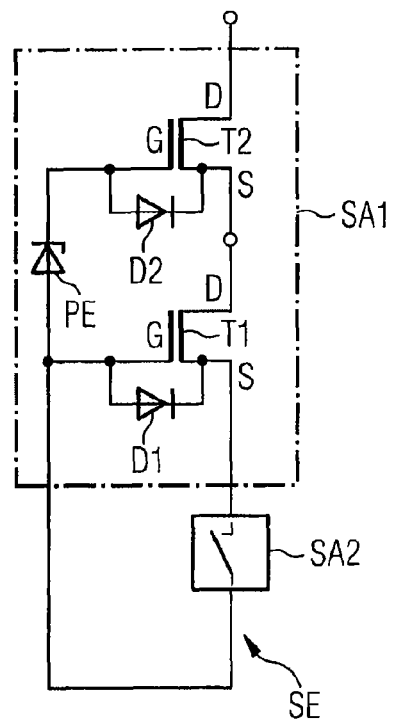

The embodiment variant in accordance with FIG. 2B differs from the one represented in FIG. 2A only in that MOSFETs T1, T2 are provided as the first and second switching elements T1, T2 in place of JFETs. In each one of the MOSFETs T1, T2, the diode D1, or respectively a diode D2, is respectively wired-in between the gate connector G and the source connector S. The protective element PE is again wired-in between the gate connectors G of the MOSFETs T1, T2.

The switching device, as represented in FIGS. 1A, 1B, 2A or 2B, includes first and the second switching arrangements wired together in a cascade. The first switching arrangement SA1 may include any number of switching elements T1, T2. The second switching arrangement SA2 may include an optically triggerable switching element for switching the switching section into a conductive state between the terminals KL1 and KL2 of the second switching arrangement in order to thus be able to switch the first switching element T1 of the first switching arrangement to become conductive.

In one embodiment, the second switching arrangement may include the optically triggerable switching element PD (see FIG. 3). The optically triggerable switching element PD can, for example, be a photodiode, whose cathode connector is connected with the terminal KL1 and whose anode connector with the terminal KL2. The photodiode PD becomes conductive by illuminating it with light, so that a low-ohmic connection is established between the gate connector G and the source connector S of the first switching element T1 of the first switching arrangement SA1, so that the first switching arrangement SA1 makes a transition into the conducting state. In the embodiment represented in FIG. 3, the optically triggerable switching element PD is capable of carrying the current flowing over the switching section.

FIG. 3B shows a schematic representation of an arrangement for optically triggering the photodiode PD. This arrangement includes a transmitting element PS, a resistor R30, and a signal generator SG. The anode connector of the transmitting element PS is connected with the resistor R30, which is provided for limiting the current. The cathode connector of the transmitting element PS is coupled with a reference potential. By the appropriate triggering of the signal generator SG, a current is generated by the resistor R30 and the transmitting element PS, so that the transmitting element is excited to emit electromagnetic radiation. The photodiode PD becomes conductive upon receipt of this electromagnetic radiation, so that the low-ohmic connection is established between the gate connector G and the source connector S of the first switching element T1 of the first switching arrangement SA1. The source connector S of the first switching element T1 of the first switching arrangement SA1 changes into a conductive state.

FIG. 4 shows a second exemplary embodiment of the switching arrangement SA2. A resistor R21 with a serially wired bipolar transistor T21 is arranged between the terminals KL1 and K12. A serial circuit including the optically triggerable structural component PD and a resistor R22 is provided in parallel with resistor R21. A node point KP21 of this serial circuit is wired to the base connector of the bipolar transistor T21. If the optically triggerable switching element PD is a phototransistor, a further resistor can be provided for regulating the current. By switching the photodiode PD to be conductive, a basic current flows into the transistor T21, so that it becomes conductive. As a result, triggering of the first switching element T1 of the first switching arrangement SA1 can take place. The resistor R21 is used for maintaining the bipolar transistor T21 in the conducting state, so that it does not make a transition into the blocking state in spite of the triggering of the photodiode PD. The resistor R22 is used for setting the operating point of the bipolar transistor T21.

Figure 5:
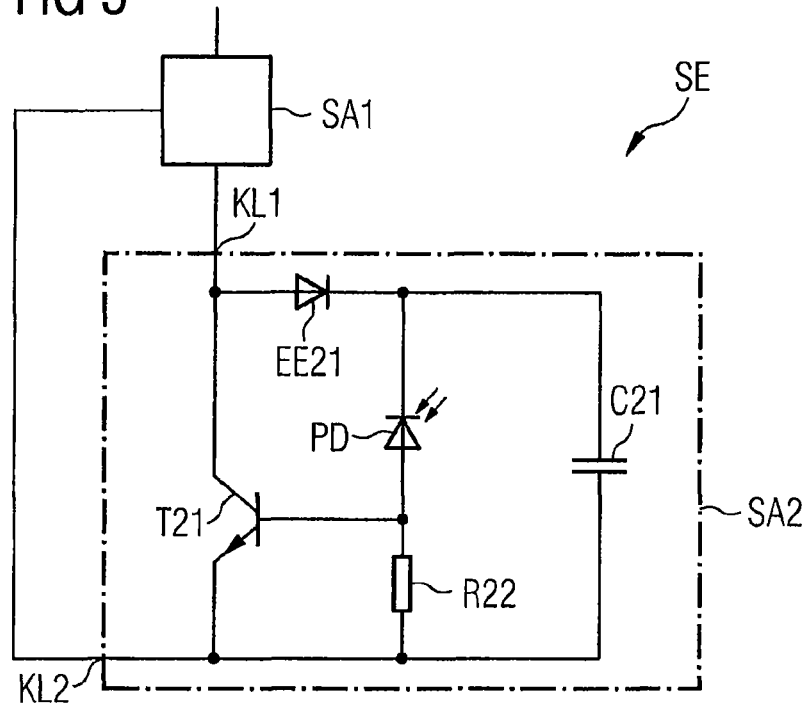
FIG. 5 shows a representation of a switching device having a third variation of the second switching arrangement.

In another embodiment of the second switching arrangement SA2, which is represented in FIG. 5, only the bipolar transistor T21 is wired-in between the terminals KL1 and KL2 of the switching arrangement SA2. A capacitor C21 is wired parallel with the photodiode PD and the second resistor R22, which is serially wired with it. An uncoupling diode EE21 is wired between the terminal KL1 and the cathode connector of the photodiode PD, or respectively the capacitor C21. The bipolar transistor T21 may be maintained in a conducting state via the intermediate voltage circuit constituted by the capacitor C21 when the photodiode PD is illuminated. It is possible here to minimize the losses occurring over the switching section of the second switching arrangement SA2, because the resistor R21 provided in the exemplary embodiment of FIG. 4 can be omitted. The uncoupling diode EE21 is used for preventing the discharge of the capacitor C21.

In the exemplary embodiments represented in FIGS. 4 and 5, the optically triggerable switching element PD is used as a control element for the bipolar transistor T21. Accordingly, a simple triggering with separated potentials of the second switching element SA2 for triggering the first switching arrangement SA1 is possible.

The switching device SE may be used a control element for a power semiconductor switch. The energy supply of the switching element is provided from an intermediate voltage circuit. Exemplary embodiments of this variation are represented in FIGS. 6 to 8.

Figure 6:
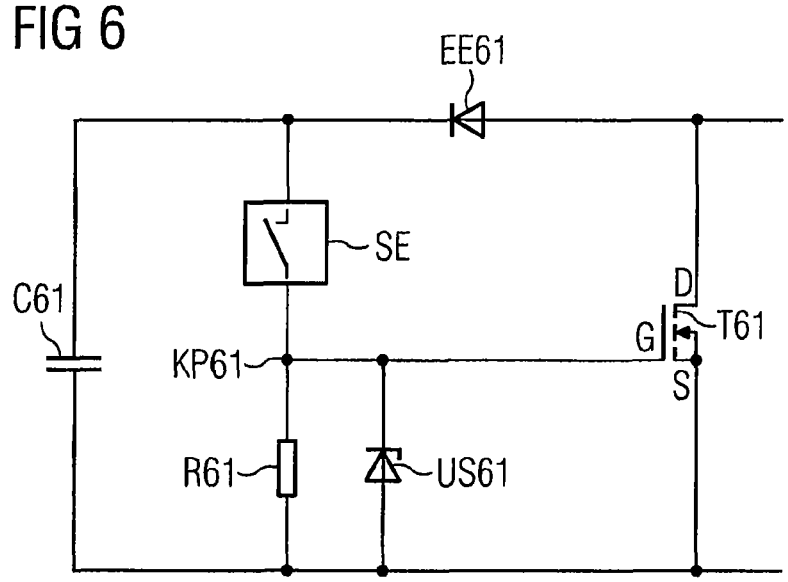
FIG. 6 shows a first embodiment of a switching arrangement having a switching device for triggering a high voltage switching element.

A switching device, for example, in accordance with one of the embodiment variations of FIGS. 3, 4 or 5, is serially wired with a resistor R61 in FIG. 6. A capacitor C61 is wired parallel with the switching device and the resistor R61 for providing an intermediate voltage circuit. The parallel circuit is connected via a decoupling diode EE61 with the drain connector D of a power semiconductor element T61 in the form of a MOSFET. The power MOSFET T61 is a self-blocking high voltage component for conducting large currents. The other connector of the resistor R61 is connected with the source connector S of the MOSFET T61. A node point KP61 formed between the switching device SE and the resistor R61 is connected with the gate connector G of the MOSFET T61. For limiting the voltage applied during the operation between the gate connector G and the source connector S, an excess voltage protection element US61, for example, in the form of a Z-diode, is provided. The cathode connector is connected with the gate connector G, and the anode connector with the source connector S of the MOSFET T61.

If the switching device SE is switched on so that it is conducting (by illuminating the optically triggerable component), a current can flow across the resistor R61 because of the discharge of the capacitor C61, so that triggering of the MOSFET results because of the voltage which arises between the gate connector G and the source connector S.

Figure 7:
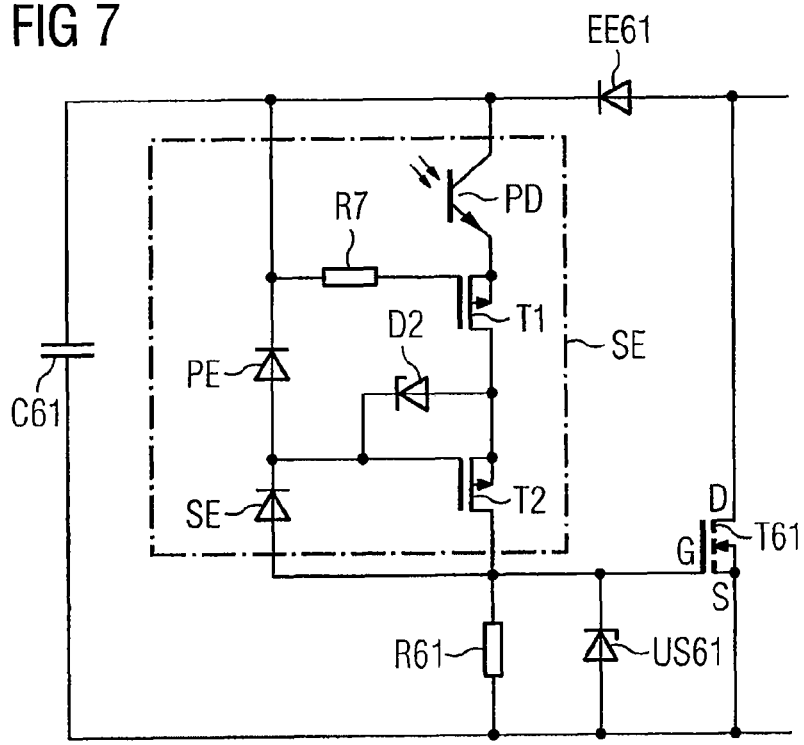
FIG. 7 shows a second embodiment of a switching arrangement having a switching device for triggering a high voltage switching element.
Figure 8:
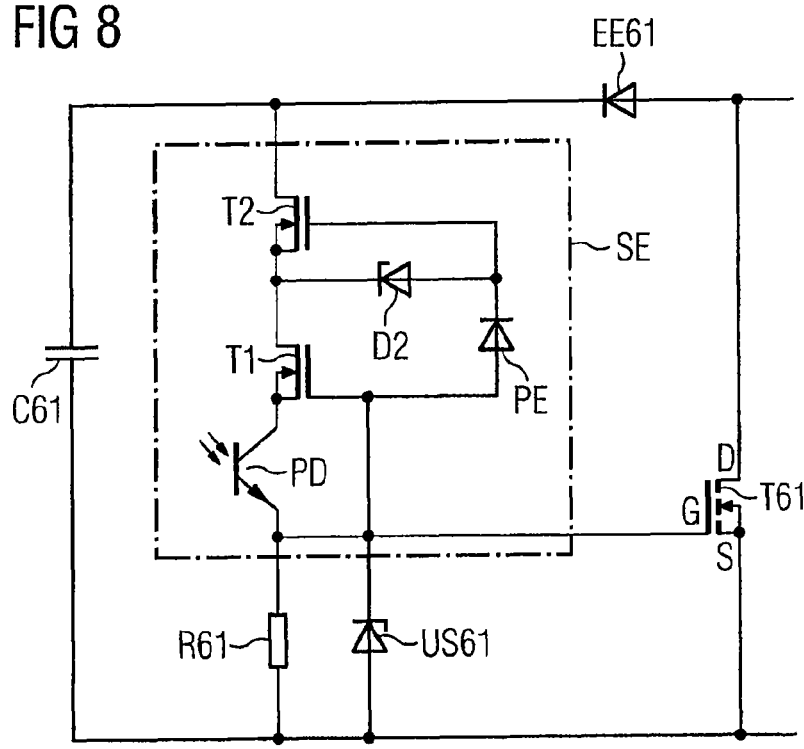
FIG. 8 shows a third embodiment of a switching arrangement with a switching device for triggering a high voltage switching element.

Exemplary embodiment variants of the switching device are represented in FIGS. 7 and 8. FIG. 7 shows an embodiment in which the switching device includes p-channel MOSFETs as the switching elements of the first switching arrangement FIG. 8 shows n-depletion MOSFETs of the first switching arrangement for triggering the power MOSFETs T61.

Figure 9:
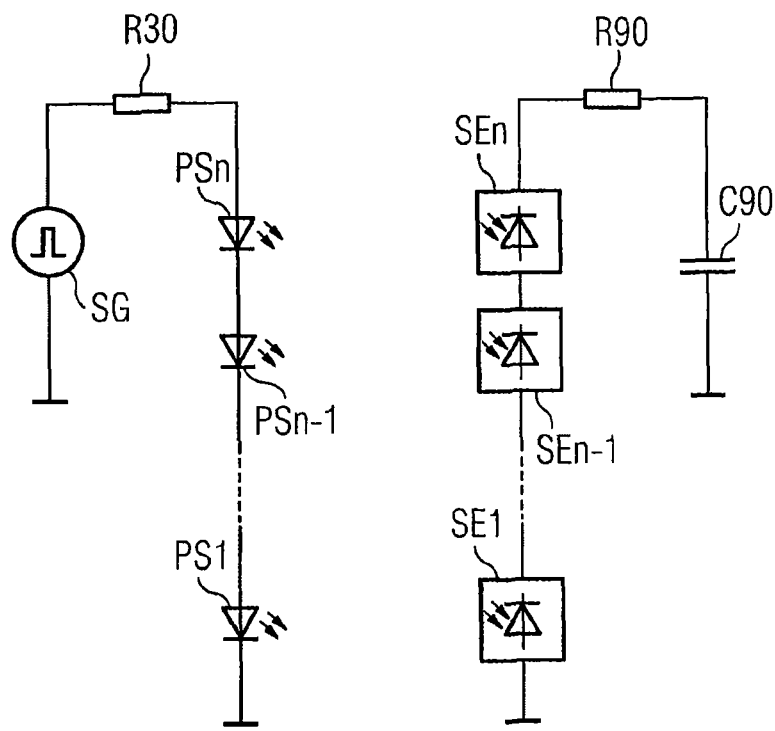
FIG. 9 shows a switching arrangement of a series connection of a number of switching devices.

A switching arrangement of a series connection of a number of switching devices SE1, . . . , SEn-1, which are connected via a resistor R90 with a high voltage capacitor C90, is represented in FIG. 9. Each one of the switching devices SE1, . . . , SEn can be embodied in accordance with one of the exemplary embodiments represented and described in FIGS. 1 to 5. Because each one for the switching devices SE1, . . . , SEn includes a second switching arrangement SA2 with an optically triggerable component, a corresponding transmitting element PS1, . . . , PSn is assigned to each one of the switching devices SE1, . . . , SEn. The transmitting elements PS1, . . . , PSn are serially wired with each other. The anode connector of the transmitting element PSn may be connected with the signal generator SG via a resistor R30. A respective cathode connector of one of the transmitting elements is connected with an anode connector of a subsequent transmitting element. The cathode connector of the transmitting element PS1 is coupled with the reference potential.

When a current is generated through the series connection of the transmitting elements PS1, . . . , PSn by the signal generator SG, all optically triggerable structural components of the second switching arrangements SA2 are simultaneously switched to become conductive, because of which the switching of the respective switching devices SE1, . . . , SEn for becoming conductive is initiated. Because of the parallel switching for becoming conductive of respective switching elements of the first switching arrangement SA1 of the switching devices SE1, . . . , SEn, it is possible to shorten the time for switching-on the entire switching arrangement. A quasi simultaneous switching-on of the switching devices SE1, . . . , SEn becomes possible when the first switching arrangement SA1 of a respective switching device SE1, . . . , SEn only includes the first self-conducting switching element T1.

The option of being able to optically trigger the switching device may result in a minimum structural element outlay. The energy supply for the trigger circuit may be omitted.

It is possible to employ optical components of reduced blocking capability, for example, within the range of 30 to 40 Volts.

In connection with an embodiment variation in accordance with FIGS. 3 or 4, the current can be set within a wide range by the cascade via the bipolar transistor T21.

The switching elements of the first switching arrangement of the switching device can be realized by any self-conducting structural component, for example, also with cost-effective depletion-n-channel or -p-channel MOSFETs.

To the extent that the optically triggerable switching element is capable of carrying the load current, the second switching arrangement can exclusively include the optically triggerable switching element. A simple switching device results.

The switching device can in turn be employed as a control element for a power semiconductor switch, in which case its energy supply can be provided by an auxiliary intermediate circuit. If there is a requirement for a reverse-conducting structural element, it is possible to connect a recovery diode parallel with the bipolar transistor D2 represented in FIGS. 3 and 4.

Various embodiments described herein can be used alone or in combination with one another. The forgoing detailed description has described only a few of the many possible implementations of the present invention. For this reason, this detailed description is intended by way of illustration, and not by way of limitation. It is only the following claims, including all equivalents that are intended to define the scope of this invention.

The invention claimed is:

1. A switching device for switching at high operating voltage, the switching device comprising:
   a first switching arrangement having a first self-conducting switching element, which has a control connector and a first and a second main connector for forming a first switching section, and
   a second switching arrangement having a first and a second connector for forming a second switching section, the second switching section being wired serially with respect to the first switching section of the first switching arrangement,
   wherein the second switching arrangement includes an optically triggerable switching element for switching the second switching section of the second switching arrangement so the second switching section becomes conductive, and the second connector is connected with the control connector of the first self-conducting switching element,
   wherein the optically triggerable switching element is operable to switch a controllable switching element to be conducting or blocking, the controllable switching element being arranged in the second switching section, and
   wherein a first resistor is controllably wired with the controllable switching element, and the optically triggerable switching element is serially wired together with a second resistor, which is connected parallel with a serial circuit including the first resistor and the controllable switching element.

2. The switching device in accordance with claim 1, wherein the first switching arrangement comprises a second self-conducting switching element, which has a control connector and a first and a second main connector for forming a switching section, the second self-conducting switching element forming a switching section of the first switching arrangement, the switching section of the first switching element and the switching section of the at least one second switching element being serially wired with each other, and
   wherein a protective element is switched between the control connectors of the first and second self-conducting switching elements.

3. The switching device in accordance with claim 2, wherein the protective element is a diode.

4. The switching device in accordance with claim 3, wherein the diode is an avalanche diode.

5. The switching device in accordance with claim 1, wherein the second switching arrangement exclusively includes the optically triggerable switching element.

6. The switching device in accordance with claim 1, wherein a node point of the serial circuit including the optically triggerable switching element and the first resistor is connected with a control connector of the controllable switching element.

7. The switching device in accordance with claim 1, wherein a capacitor and a serial circuit of the second resistor are connected parallel with the optically triggerable switching element, and the parallel connection is connected with the second main connector of the controllable switching element, and via an uncoupling element with the first main connector of the controllable switching element, and
   wherein a node point of the serial circuit including the optically triggerable switching element and the second resistor is connected with a control connector of the controllable switching element.

8. The switching device in accordance with claim 1, wherein the first self- conducting switching element and/or the at least one second self-conducting switching element are a JFET.

9. The switching device in accordance with claim 1, wherein the first self-conducting switching element and/or the at least one second self-conducting switching element is a MOSFET, the MOSFET having a gate connector connected by a respective diode with a source connector.

10. The switching device in accordance with claim 1, wherein the controllable switching element is a bipolar transistor.

11. A switching arrangement having a plurality of serially wired together switching devices, the switching devices including:
   a first switching arrangement having a first self-conducting switching element, which has a control connector and a first and a second main connector for forming a first switching section, and
   a second switching arrangement having a first and a second connector for forming a second switching section, the second switching section being wired serially with respect to the first switching section of the first switching arrangement,
   wherein the second switching arrangement includes an optically triggerable switching element for switching the second switching section of the second switching arrangement so the second switching section becomes conductive, and the second connector is connected with the control connector of the first self-conducting switching element,
   wherein the optically triggerable switching element is operable to switch a controllable switching element to be conducting or blocking, the controllable switching element being arranged in the second switching section, and
   wherein a first resistor is controllably wired with the controllable switching element, and the optically triggerable switching element is serially wired together with a second resistor, which is connected parallel with a serial circuit including the first resistor and the controllable switching element.

12. A switching arrangement comprising:
   a high voltage switching element; and
   a switching device for triggering the high voltage switching element, the switching device comprising:
      a first switching arrangement having a first self-conducting switching element, which has a control connector and a first and a second main connector for forming a first switching section, and a second switching arrangement having a first and a second connector for forming a second switching section, the second switching section being wired serially with respect to the first switching section of the first switching arrangement, wherein the second switching arrangement includes an optically triggerable switching element for switching the second switching section of the second switching arrangement so the second switching section becomes conductive, and the second connector is connected with the control connector of the first self-conducting switching element, wherein the optically triggerable switching element is operable to switch a controllable switching element to be conducting or blocking, the controllable switching element being arranged in the second switching section, and wherein a first resistor is controllably wired with the controllable switching element, and the optically triggerable switching element is serially wired together with a second resistor, which is connected parallel with a serial circuit including the first resistor and the controllable switching element.

13. The switching arrangement in accordance with claim 12, wherein the high voltage switching element has a control connector and a first and a second main connector for forming a switching section, wherein the switching device and a resistor, which is wired serially with the switching device, are wired parallel with a capacitor, wherein a node point between the switching device and the resistor is connected with the control connector of the high voltage switching element, and wherein the parallel circuit consisting of the capacitor and of the serial circuit consisting of the switching device and the resistor is connected via an uncoupling element with the first main connector of the high voltage switching element.

14. The switching arrangement in accordance with claim 13, wherein an excess voltage protective element is switched between the control connector and the second main connector of the high voltage switching element.

15. The switching arrangement in accordance with claim 12, wherein the high voltage switching element is a voltage-controlled, self-blocking semiconductor component.

16. The switching arrangement in accordance with claim 15, wherein the high voltage switching element is a MOSFET or an IGBT.

* * * * *